(12) United States Patent
Narukawa et al.

(10) Patent No.: US 11,864,340 B2
(45) Date of Patent: Jan. 2, 2024

(54) RACK FOR STORING ELECTRICAL EQUIPMENT

(71) Applicant: SUMITOMO ELECTRIC INDUSTRIES, LTD., Osaka (JP)

(72) Inventors: Hisahiko Narukawa, Komaki (JP);
Takayuki Yokochi, Osaka (JP);
Shinsuke Sato, Komaki (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 17/380,537

(22) Filed: Jul. 20, 2021

(65) Prior Publication Data
US 2022/0022338 A1    Jan. 20, 2022

(30) Foreign Application Priority Data
Jul. 20, 2020  (JP) .................. 2020-123516

(51) Int. Cl.
*H05K 7/18*    (2006.01)
*H05K 5/02*    (2006.01)
*H05K 7/14*    (2006.01)
*H05K 5/03*    (2006.01)

(52) U.S. Cl.
CPC ............ *H05K 7/18* (2013.01); *H05K 5/0226* (2013.01); *H05K 5/03* (2013.01); *H05K 7/1488* (2013.01)

(58) Field of Classification Search
CPC . H02B 1/306; H02B 1/38; H02B 1/44; H02B 1/56; H02B 1/565; H05K 7/18; H05K 7/1488; H05K 5/0226; H05K 5/03
See application file for complete search history.

(56) References Cited

U.S. PATENT DOCUMENTS

| | | | | | |
|---|---|---|---|---|---|
| 6,015,197 | A * | 1/2000 | DiGiacomo | ........... | H02B 1/305 52/220.8 |
| 8,482,903 | B2 * | 7/2013 | Milovac | ................. | H02B 11/00 361/639 |
| 8,733,855 | B2 * | 5/2014 | Josten | .................. | H02B 13/025 361/600 |
| 8,791,361 | B2 * | 7/2014 | Gingrich | ................ | H02B 1/565 361/605 |
| 8,952,252 | B2 * | 2/2015 | Bugaris | ................ | H02B 13/025 218/156 |
| 9,438,015 | B2 * | 9/2016 | Arcos | .................. | H02B 13/025 |
| 9,462,710 | B2 * | 10/2016 | Karandikar | .......... | H02B 13/025 |
| 10,477,719 | B1 * | 11/2019 | An | ........................ | H05K 7/1489 |
| 10,591,693 | B2 * | 3/2020 | Yamauchi | ............ | G02B 6/4471 |
| 10,855,059 | B2 * | 12/2020 | Valsecchi | ............. | H01R 25/161 |

(Continued)

FOREIGN PATENT DOCUMENTS

CA    2561695 A1 *   3/2008   ............... E05C 9/02
JP    2011-155211 A    8/2011

(Continued)

*Primary Examiner* — Patrick D Hawn
(74) *Attorney, Agent, or Firm* — Oliff PLC

(57) ABSTRACT

A rack for storing electrical equipment includes a columnar frame formed by combining a vertical frame and a horizontal frame and a connecting member attached to the horizontal frame. The horizontal frame has a first portion including the connecting member and a second portion other than the first portion. The connecting member is movably attached to the second portion so that an inside of the rack is opened in the first portion.

5 Claims, 6 Drawing Sheets

(56) References Cited

U.S. PATENT DOCUMENTS

| | | | | |
|---|---|---|---|---|
| 10,938,189 | B2* | 3/2021 | Valsecchi | H02B 11/173 |
| 11,083,102 | B1* | 8/2021 | Darche | H05K 7/023 |
| 11,159,000 | B2* | 10/2021 | Hawkins | H01H 33/04 |
| 2011/0299226 | A1* | 12/2011 | Milovac | H02B 11/00 |
| | | | | 361/605 |
| 2015/0036310 | A1* | 2/2015 | Karandikar | H02B 13/025 |
| | | | | 361/837 |
| 2021/0119423 | A1* | 4/2021 | Benedetti | H02B 1/306 |
| 2021/0119425 | A1* | 4/2021 | Benedetti | H02B 1/38 |
| 2021/0288475 | A1* | 9/2021 | Hawkins | H01H 33/53 |
| 2021/0345509 | A1* | 11/2021 | Marcus | E05D 7/123 |

FOREIGN PATENT DOCUMENTS

| | | | |
|---|---|---|---|
| JP | 2013-239616 A | 11/2013 | |
| JP | 2014-085468 A | 5/2014 | |
| KR | 101607911 B1 * | 4/2016 | H02B 1/56 |

\* cited by examiner

RACK FOR STORING ELECTRICAL EQUIPMENT

CROSS-REFERENCE TO RELATED APPLICATIONS

This application is based on and claims priority under 35 USC 119 from Japanese Patent Application No. 2020-123516 filed on Jul. 20, 2020, the contents of which are incorporated herein by reference.

TECHNICAL FIELD

The present disclosure relates to a rack for storing electrical equipment.

BACKGROUND

JP-A-2014-085468 discloses a wall-mounted optical connection box in which an extra length portion of an optical fiber and an optical connection portion of an optical cable are accommodated. JP-A-2011-155211 and JP-A-2013-239616 disclose a self-standing cabinet rack and a storage box for storing various devices such as electronic devices, electrical devices, and communication devices.

SUMMARY

The wall-mounted connection box as in JP-A-2014-085468 has notches on upper and lower surfaces of a housing for introducing a cable. Further, as disclosed in JP-A-2013-239616, in the self-standing rack, a cable introduction portion formed on an upper surface of the housing has a hole shape due to a problem such as a structure for holding the door. Therefore, there is a case where workability may be inferior when a cable to be wired to an internal device of the rack is pulled into the rack from the cable introduction portion.

Therefore, an object of the present disclosure is to provide a rack for storing electrical equipment, which can improve workability when introducing a cable or the like inside of the rack.

According to one aspect of the present disclosure, a rack for storing electrical equipment includes: a columnar frame formed by combining a vertical frame and a horizontal frame; and a connecting member attached to the horizontal frame, in which the horizontal frame has a first portion including the connecting member and a second portion other than the first portion, and in which the connecting member is movably attached to the second portion such that an inside of the rack is opened in the first portion.

According to the present disclosure, it is possible to provide a rack for storing electrical equipment, which can improve workability when introducing a cable or the like inside of the rack.

DETAILED DESCRIPTION

Description of Illustrative Embodiment of Present Disclosure

First, an illustrative embodiment of the present disclosure will be listed and described.

(1) A rack for storing electrical equipment according to one aspect of the present disclosure includes: a columnar frame formed by combining a vertical frame and a horizontal frame; and a connecting member attached to the horizontal frame, in which the horizontal frame has a first portion including the connecting member and a second portion other than the first portion, and in which the connecting member is movably attached to the second portion such that an inside of the rack is opened in the first portion.

According to the present disclosure, a part of a horizontal frame forming a frame of a rack can be opened or closed. As a result, workability when introducing a cable or the like into the inside of the rack is improved.

(2) The connecting member may be attached to the second portion by a hinge.

According to the present disclosure, a part of the horizontal frame can be opened or closed with a simple configuration.

(3) The rack for storing electrical equipment further includes a cover attached to the rack such that an opening of the rack including the first portion which can be opened by the connecting member is covered, in which the cover may have an opening and closing portion which allows the inside of the rack to be opened in the first portion.

According to the present disclosure, it is possible to improve workability such as cable introduction while sufficiently ensuring a dustproof property inside the rack by the cover.

Details of Illustrative Embodiment of Present Disclosure

A specific example of a rack for storing electrical equipment (hereinafter, referred to as a rack) according to the illustrative embodiment of the present disclosure will be described with reference to the drawings. In the illustrative embodiment, the "left-right direction", "front-rear direction", and "up-down direction" are relative directions set for a rack 1 illustrated in FIG. 1 for convenience of explanation. The present disclosure is not limited to these examples and is indicated by the scope of claims, and further, is intended to include all modifications within the meaning and scope equivalent to the scope of claims.

Figure 1:
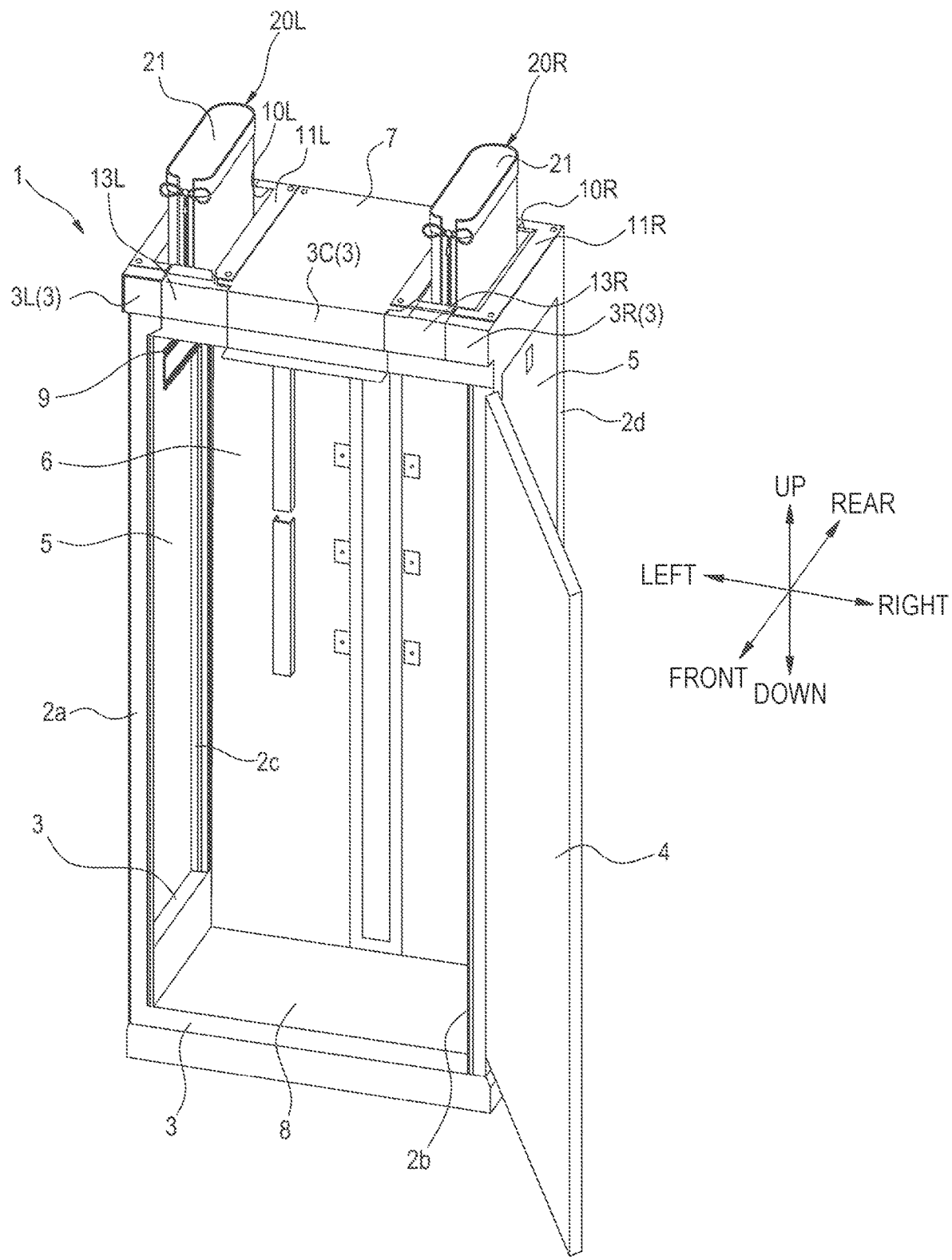
FIG. 1 is a perspective view illustrating a rack for storing electrical equipment according to an illustrative embodiment of the present disclosure.
Figure 2:
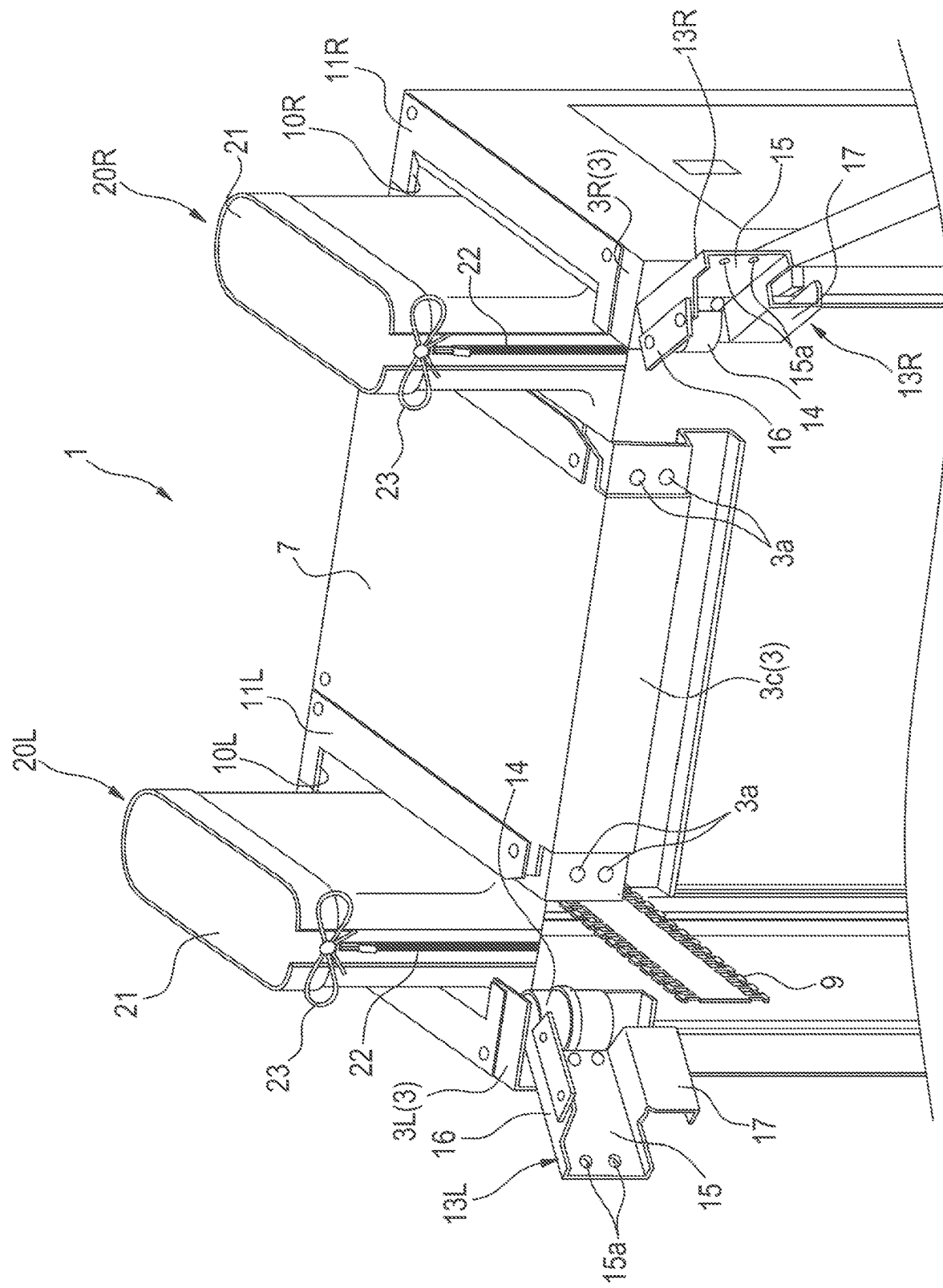
FIG. 2 is a partially enlarged perspective view illustrating an upper part of the rack of FIG. 1.

FIG. 1 is a diagram illustrating the rack 1 according to the illustrative embodiment. FIG. 2 is a partially enlarged perspective view illustrating an upper part of the rack 1. As illustrated in FIG. 1, the rack 1 includes a columnar frame (rectangular parallelepiped frame) having a frame at a ridge of a columnar body (rectangular parallelepiped body). The columnar body is composed of four vertical frames 2a, 2b, 2c, and 2d arranged at four corners and a plurality of horizontal frames 3 combined with four vertical frames 2a to 2d. The rack 1 further includes a front door 4, side doors 5 and 5, a back plate 6, a ceiling plate 7, and a bottom plate 8. The rack 1 is used, for example, as a box for storing electrical equipment. Inside the rack 1, internal devices such as servers and other electronic devices, breakers and other electrical devices, and communication devices can be mounted and optical fibers, optical cables, and their connection parts can be stored. The rack 1 is a self-standing type installed on a floor or the ground and is also called a cabinet, a box, or the like. Further, a plurality of racks 1 may be arranged side by side in a row in a data center or the like.

A cable fixture 9 is attached to the back plate 6 so as to protrude toward the front door 4 side. The ceiling plate 7 is provided with two openings 10L and 10R at positions corresponding to the cable fixture 9. The openings 10L and 10R are each formed in a rectangular shape. Rectangular fixed frames 11L and 11R are attached around the openings 10L and 10R to match the shape of the openings 10L and 10R.

Among the plurality of horizontal frames 3, the horizontal frame 3 provided at an upper end of a front surface of the rack 1 in the left-right direction is composed of two side frames 3L and 3R and an intermediate frame 3C. Among the two side frames 3L and 3R, the left side frame 3L is provided so as to protrude to the right from an upper end of the vertical frame 2a arranged on a left front surface. Among the two side frames 3L and 3R, the right side frame 3R is provided so as to protrude to the left from an upper end of the vertical frame 2b arranged on a right front surface. The intermediate frame 3C is arranged at a certain distance from the two side frames 3L and 3R. That is, a length of the intermediate frame 3C is shorter than a distance between the left side frame 3L and the right side frame 3R. The intermediate frame 3C is fixed to a front end portion of the ceiling plate 7 interposed between the opening 10L and the opening 10R. The side frames 3L and 3R and the intermediate frame 3C are formed so that a portion overlapping the front door 4 at a lower portion thereof is bent in a substantially U shape. As a result, in a case where the front door 4 is closed, the side frames 3L and 3R and the intermediate frame 3C do not interfere with the front door 4.

Notches are formed on front surfaces of the fixed frame 11L and 11R. The notch is notched so that a part of each of the fixed frames 11L and 11R is opened according to a space formed between the side frame 3L and the intermediate frame 3C and a space between the side frame 3R and the intermediate frame 3C.

Further, connecting members 13L and 13R are attached to the horizontal frame 3 so as to block the space formed between the side frame 3L and the intermediate frame 3C and the space between the side frame 3R and the intermediate frame 3C. Further, covers 20L and 20R are respectively mounted inside the openings 10L and 10R.

As illustrated in FIG. 2, the connecting member 13L is attached to the side frame 3L by a hinge 14. Similarly, the connecting member 13R is attached to the side frame 3R by a hinge 14. Each of the connecting members 13L and 13R is composed of a rectangular front plate 15, an upper plate 16, and a lower plate 17. Two screw holes 15a and 15a are formed on a side of the front plate 15 opposite to a side attached to the hinge 14. With the connecting members 13L and 13R closed, the front plate 15 is screwed and fixed to a screwed portion 3a of the intermediate frame 3C via the screw holes 15a and 15a. The upper plate 16 is formed so as to be continuous with the front plate 15 so as to bend rearward from the upper portion of the front plate 15. The upper plate 16 is inserted into the notch of each of the fixed frames 11L and 11R in a state where the connecting members 13L and 13R are closed and closes the notch. The lower plate 17 is formed so as to be bent in a substantially U shape, similarly to the side frames 3L and 3R and the intermediate frame 3C. As a result, the front door 4 can be closed without the connecting members 13L and 13R and the front door 4 interfering with each other.

The covers 20L and 20R are purse-shaped bags. Lower ends of the covers 20L and 20R are respectively attached to the opening 10L and 10R so as to be interposed between the ceiling plate 7 and the fixed frames 11L, and 11R. Each of the covers 20L and 20R has a mouth portion 21 and a fastener 22 is provided on a front surface of each of the covers 20L and 20R along the up-down direction. As a result, the front surfaces of the covers 20L and 20R can be opened or closed. A string 23 is passed through the mouth portion 21 of each of the covers 20L and 20R and the mouth portion 21 can be closed with the string 23.

Figure 3:
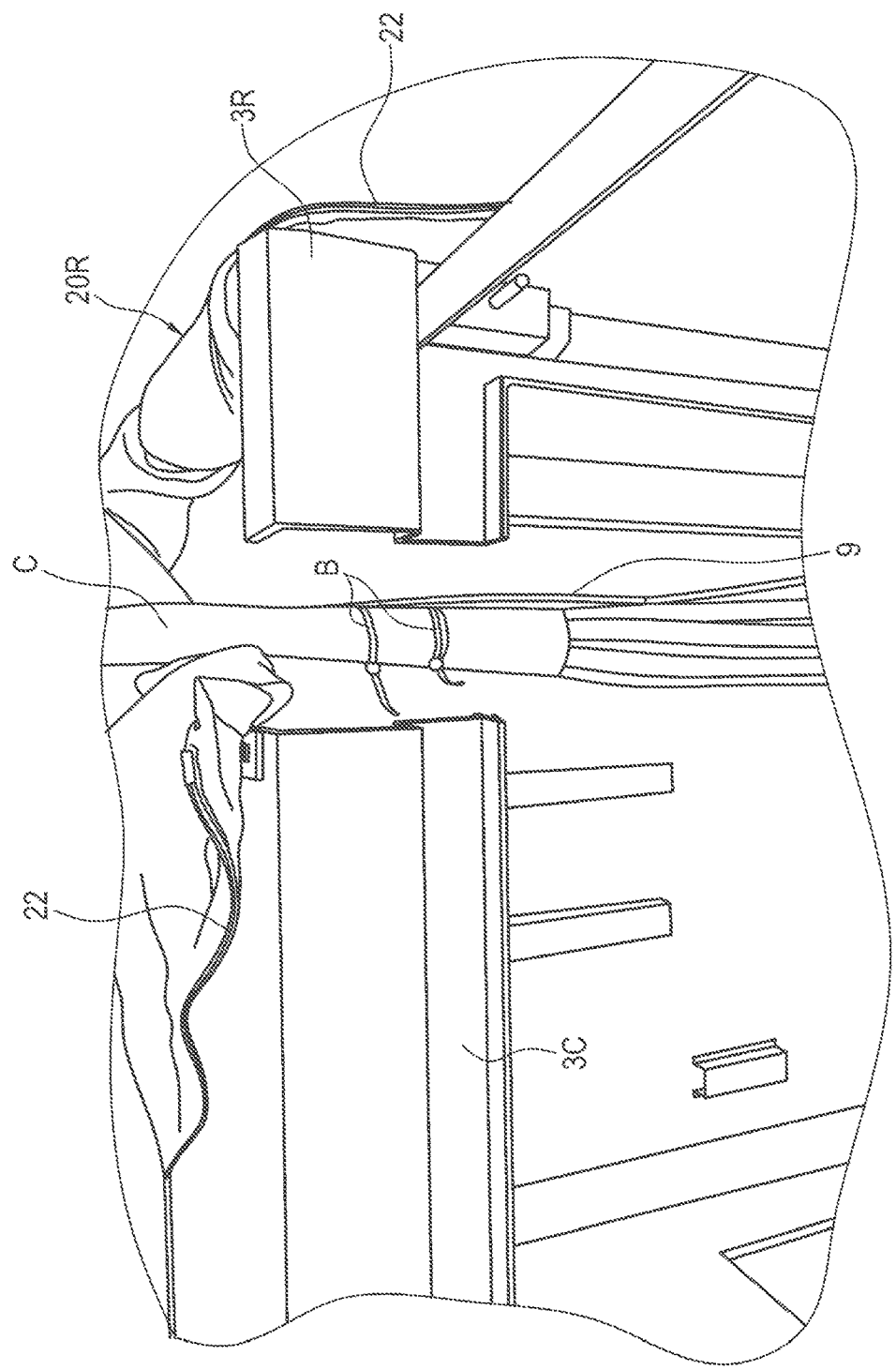
FIG. 3 is a diagram illustrating a state in which a fastener of a cover is opened in the rack of FIG. 1.
Figure 4:
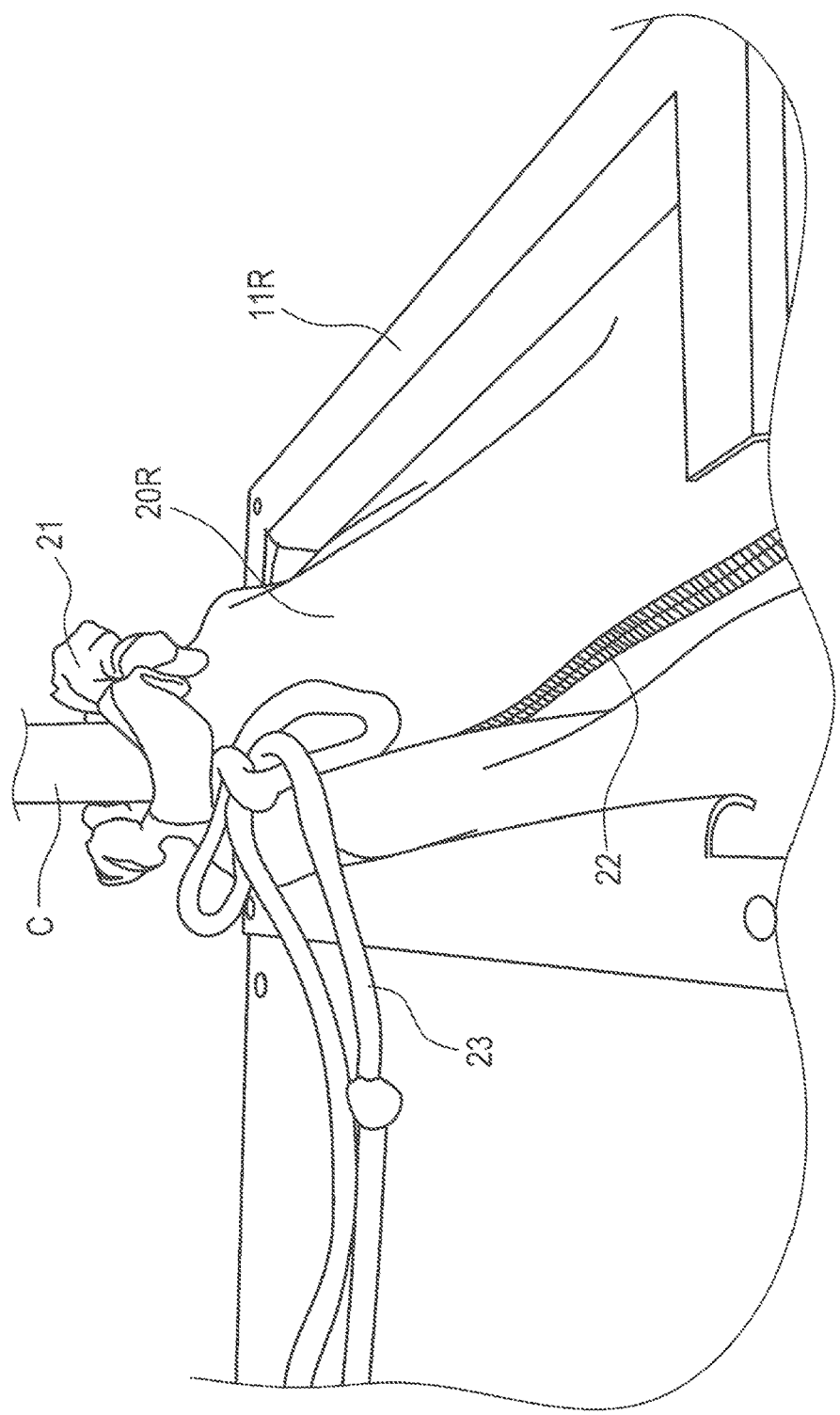
FIG. 4 is a diagram illustrating a state in which the fastener of the cover is closed and a mouth of the cover is closed with a string in the rack of FIG. 1.

Next, a method of introducing the cable into the rack 1 will be described with reference to FIGS. 2, 3, and 4. FIG. 3 is a diagram illustrating a state in which the mouth portion 21 and the fastener 22 of the cover 20R attached to the opening 10R on a right side of the rack 1 are opened. FIG. 4 is a diagram illustrating a state in which the fastener 22 is closed and the mouth portion 21 of the cover 20R is closed with the string 23. The connecting member 13R is not illustrated in FIGS. 3 and 4.

In a case where a cable or the like are introduced into the rack 1, an operator first opens the front door 4 as illustrated in FIG. 2. Next, the operator removes screws (not illustrated) which have screwed and fixed the connecting members 13L and 13R via the screw holes 15a and 15a and rotates the connecting members 13L and 13R with the hinges 14 as the rotation axis, in such a manner that the spaces between the side frames 3L and 3R and the intermediate frame 3C are opened. Next, as illustrated in FIG. 3, the operator loosens the string 23 of the cover 20R and opens the fastener 22. By opening the connecting member 13R and the mouth portion 21 and the fastener 22 of the cover 20R in this way, the operator can access the inside of the rack 1 from the front door 4 side of the rack 1. Next, the operator inserts a cable C into the rack 1 from a front side of the opened rack 1 and fixes the cable C to the cable fixture 9. The cable C is fixed to the cable fixture 9 by, for example, a binding band B. In a case where the fixing of the cable C is completed, the operator closes the fastener 22 of the cover 20R and closes the mouth portion 21 of the cover 20R with the string 23 as illustrated in FIG. 4. Although not illustrated in FIG. 4, the open connecting member 13R is tilted toward the intermediate frame 3C and the notch of the fixed frame is closed by the upper plate 16 of the connecting member 13R. Finally, the screw holes 15a and 15a of the connecting member 13R and the screwed portion 3a of the intermediate frame 3C are screwed and fixed. That is, the connecting member 13R is fixed in the closed state.

Figure 5:
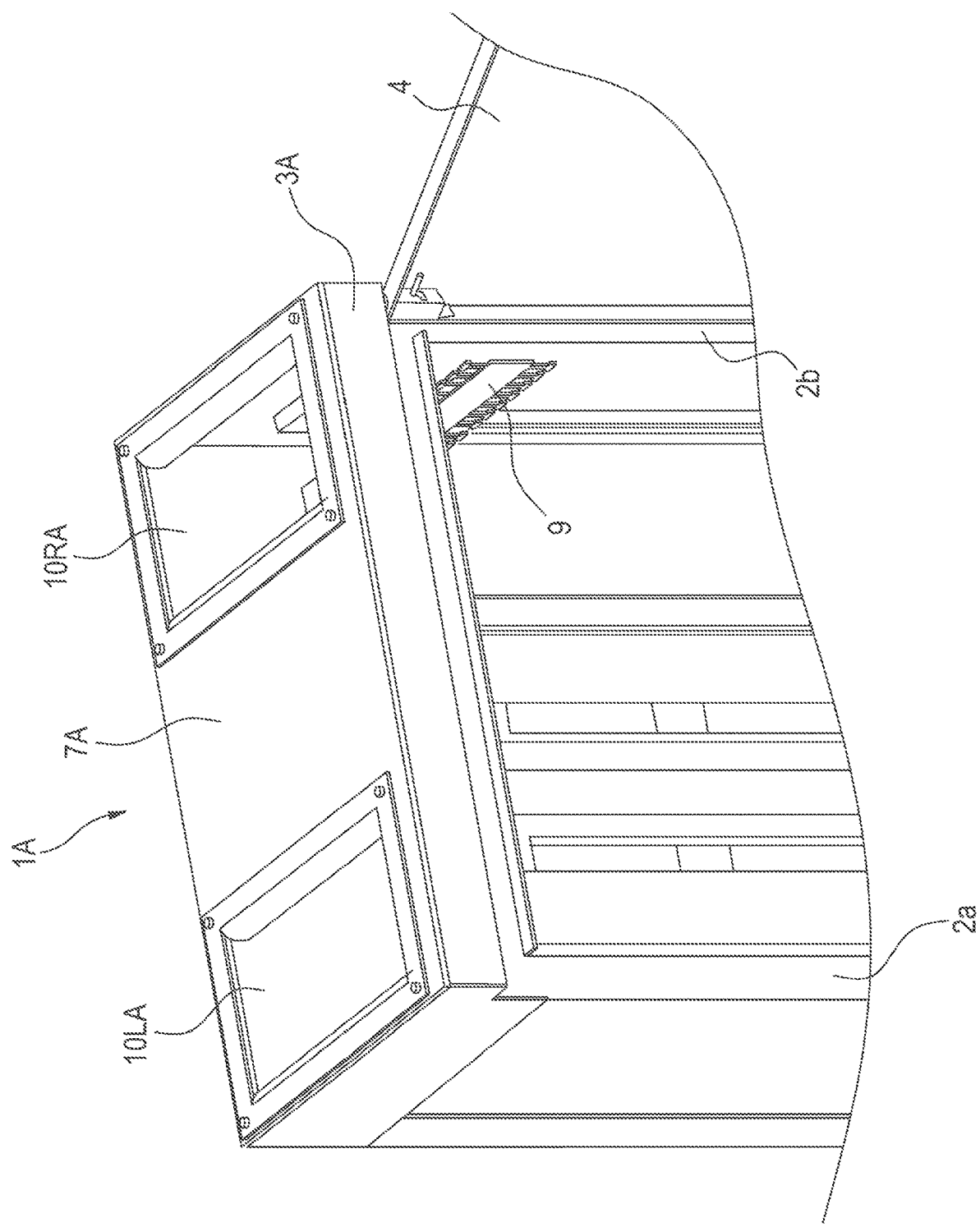
FIG. 5 is a partially enlarged perspective view illustrating a rack for storing electrical equipment according to a reference example.

By the way, in a case of a rack 1A of a reference example illustrated in FIG. 5, although it has a columnar frame, a horizontal frame 3A provided on an upper part on a front side of the rack 1A is continuously extended from a vertical frame 2a to a vertical frame 2b. Therefore, in a case where a cable is introduced into the rack 1A, it is necessary to insert the cable from openings 10LA and 10RA formed on a ceiling plate 7A and perform a cable fixing work. As a result, there is room for improvement in workability when fixing the cable to the cable fixture 9.

The rack 1 according to the illustrative embodiment described above also includes the columnar frame formed by combining the vertical frames 2a to 2d and the horizontal frame 3. The horizontal frame 3 of the rack 1 has the connecting members 13L and 13R and the side frames 3L and 3R and the intermediate frame 3C (an example of a second portion) which are parts other than the part including the connecting members 13L and 13R and the connecting members 13L and 13R are movably attached to the side frames 3L and 3R. As a result, an inside of the rack 1 is opened in a portion (an example of a first portion) between the side frames 3L and 3R and the intermediate frame 3C. According to this configuration, an optical component such as a cable C can be introduced into the rack 1 from the front door 4 side of the rack 1, so that workability is improved.

Further, the connecting members 13L and 13R are attached to the side frames 3L and 3R by the hinges 14. As a result, a part of the horizontal frame 3 provided on the front side of the rack 1 can be opened or closed with a simple configuration.

Further, the rack 1 further includes the covers 20L and 20R attached to the rack 1 so as to cover the openings 10L and 10R of the rack 1 and the covers 20L and 20R have the fasteners 22 (an example of an opening and closing portion) which allow the inside of the rack 1 to be opened in regions formed between the side frames 3L and 3R and the intermediate frame 3C. According to this configuration, the covers 20L and 20R can sufficiently secure a dustproof property of the rack 1 and improve the workability.

Although the present disclosure is described in detail and with reference to specific illustrative embodiments, it will be apparent to those skilled in the art that various changes and modifications can be made without departing from the spirit and scope of the present disclosure. Further, the number, position, shape, and the like of the constituent members described above are not limited to the illustrative embodiments described above and can be changed to a number, position, shape, and the like suitable for carrying out the present disclosure.

Figure 6:
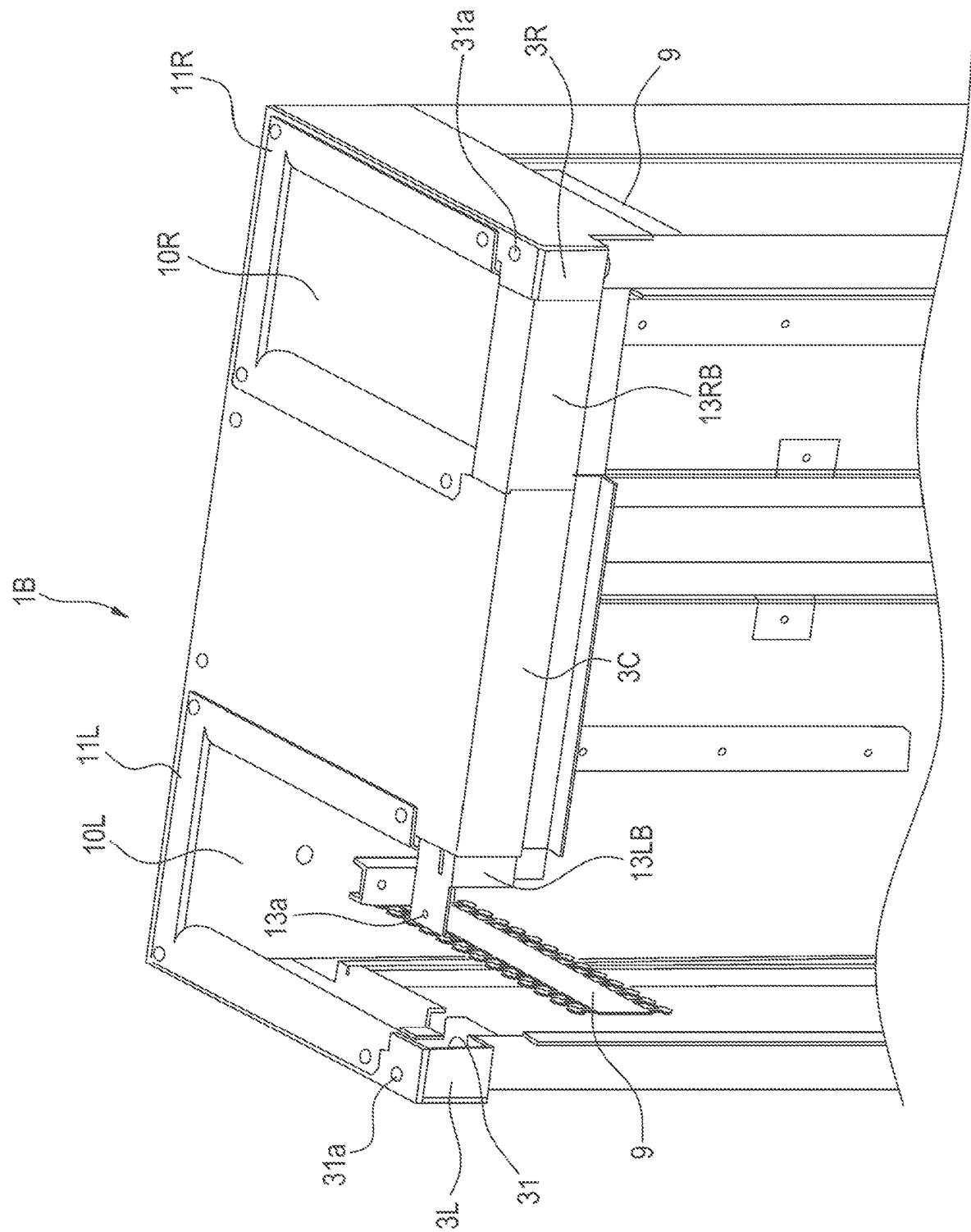
FIG. 6 is a partially enlarged perspective view illustrating a rack for storing electrical equipment according to a modification example.

In the illustrative embodiment described above, the configuration in which the connecting members 13L and 13R can be opened or closed with respect to the horizontal frame 3 (side frames 3L and 3R and intermediate frame 3C) by the hinges 14 is described, but the present disclosure is not limited to this example. FIG. 6 is a partially enlarged perspective view illustrating a rack 1B according to a modification example. In the rack 1B illustrated in FIG. 6, connecting members 13LB and 13RB can be moved by a sliding type instead of a hinge type. That is, the connecting members 13LB and 13RB can move along an extending direction (left-right direction) of the horizontal frame 3 and are accommodated in an intermediate frame 3C of the horizontal frame 3. Therefore, spaces between the intermediate frame 3C and the side frames 3L and 3R are opened. Even with this configuration, since an optical component such as a cable C can be introduced into rack 1 from a front door 4 side of the rack 1, workability is improved as in the illustrative embodiment described above. After the introduction of the cable is completed, the connecting members 13LB and 13RB are slid to the side frame 3L and 3R sides, and ends of the connecting members 13LB and 13RB opposite to the intermediate frame 3C are inserted into openings 31 formed in the side frames 3L and 3R. Then, the connecting members 13LB and 13RB are screwed and fixed to screwed portions 31a formed in the side frames 3L and 3R. by screw holes 13a and 13a formed in the ends.

Further, in the illustrative embodiment described above, an example in which the connecting members 13L and 13R are attached to the horizontal frame 3 arranged in the upper part of the front surface of the rack 1 is described, but the present disclosure is not limited to this example. For example, in the plurality of horizontal frames 3, a part of the horizontal frames 3 arranged above the side doors 5 and 5 may be opened or closed by a connecting member. In this case as well, the inside of the rack 1 can be accessed not only from the upper surface of the rack 1 but also from the side surface side, and thus workability is improved.

What is claimed is:

1. A rack for storing electrical equipment, comprising:
   a front surface that has a front door that covers a front door opening;
   a horizontal frame assembly extending in a horizontal direction above the front door opening; and
   a ceiling plate extending rearward from the horizontal frame assembly and being provided with a ceiling plate opening;
   wherein the horizontal frame assembly includes (i) an intermediate frame member and (ii) a connecting member arranged at an end of the intermediate member,
   wherein the connecting member is movably attached to the rack and is movable between (i) an open position in which a space exists beside the intermediate frame member, the space being continuous with the front door opening and the ceiling plate opening, and (ii) a closed position in which the space is blocked, and
   wherein, in a state in which the front door is in an open state and the connecting member is in the open position, an elongate object extending along a longitudinal axis can simultaneously pass, in a direction perpendicular to the longitudinal axis, through the front door opening and the space into the ceiling plate opening.

2. The rack for storing electrical equipment according to claim 1,
   wherein the connecting member is attached to the rack by a hinge.

3. The rack for storing electrical equipment according to claim 1, further comprising a purse-shaped cover attached to the rack such that the ceiling plate opening is covered,
   wherein the cover includes (i) a fastener that opens and closes a cover opening of the cover, the cover opening in an open state being continuous with the space and allowing the elongate object to pass, in the direction perpendicular to the longitudinal axis, through the cover opening, and (ii) a mouth portion that surrounds the elongate object.

4. The rack for storing electrical equipment according to claim 1, further comprising:
   a fixed frame attached around the ceiling plate opening,
   wherein the fixed frame has a notch at the space, the notch being configured such that the elongate object can pass through notch in the direction perpendicular to the longitudinal axis, and
   wherein the notch is closed by the connecting member in the closed position.

5. The rack for storing electrical equipment according to claim 3, further comprising a string that closes the mouth portion and draws the mouth portion closely around the elongate member.

* * * * *